(12) United States Patent
Tzu

(10) Patent No.: US 7,434,194 B2
(45) Date of Patent: Oct. 7, 2008

(54) MASK FOR FABRICATING SEMICONDUCTOR DEVICES AND METHOD FOR DESIGNING THE SAME

(75) Inventor: San De Tzu, Taipei (TW)

(73) Assignee: Remarkable Limited, Tai Po (HK)

( * ) Notice: Subject to any disclaimer, the term of this patent is extended or adjusted under 35 U.S.C. 154(b) by 447 days.

(21) Appl. No.: 11/187,499

(22) Filed: Jul. 22, 2005

(65) Prior Publication Data

US 2006/0026550 A1 Feb. 2, 2006

(30) Foreign Application Priority Data

Jul. 28, 2004 (TW) ............................... 93122515 A

(51) Int. Cl.
*G06F 17/50* (2006.01)
(52) U.S. Cl. ........................................................ 716/19
(58) Field of Classification Search .................... 716/19
See application file for complete search history.

(56) References Cited

U.S. PATENT DOCUMENTS

| 5,754,543 | A * | 5/1998 | Seid ........................... 370/351 |
| 6,190,809 | B1 * | 2/2001 | Tzu et al. ........................ 430/5 |
| 6,493,860 | B2 * | 12/2002 | Nakajima ..................... 716/13 |
| 6,850,904 | B2 * | 2/2005 | Ballas et al. .................. 705/29 |
| 7,231,374 | B1 * | 6/2007 | Balasinski .................. 705/400 |
| 7,303,243 | B2 * | 12/2007 | Akagawa et al. ................ 347/2 |
| 2002/0002699 | A1 * | 1/2002 | Nakajima ........................ 716/5 |
| 2003/0009739 | A1 * | 1/2003 | Watanabe et al. .............. 716/19 |
| 2004/0039584 | A1 * | 2/2004 | Mori et al. ...................... 705/1 |
| 2004/0157143 | A1 * | 8/2004 | Taniguchi ..................... 430/30 |
| 2004/0237061 | A1 * | 11/2004 | Kahng et al. .................. 716/19 |
| 2005/0015739 | A1 * | 1/2005 | Scheffer et al. ............... 716/11 |
| 2006/0057857 | A1 * | 3/2006 | Fleming et al. ............. 438/761 |

FOREIGN PATENT DOCUMENTS

JP       P2002-25800  A       1/2002
JP       P2002-25900  A       1/2002

* cited by examiner

*Primary Examiner*—Jack Chiang
*Assistant Examiner*—Suchin Parihar
(74) *Attorney, Agent, or Firm*—Egbert Law Offices

(57) ABSTRACT

The present method for designing a mask includes calculating the maximum layout number of patterns on a mask substrate, calculating a first mask cost and a second mask cost, calculating the total cost for fabricating a predetermined number of wafers using the first mask and the second mask, and selecting a lower total cost to design the pattern number on a mask substrate. Preferably, the pattern number on the first mask is equal to the maximum layout number, and the pattern number on the second mask is smaller than the maximum layout number. The present mask includes a mask substrate, a first pattern positioned on a first portion of the mask substrate for defining the shape of a first layer on a wafer, and a second pattern positioned on a second portion of the mask substrate for defining the shape of a second layer on the wafer.

14 Claims, 9 Drawing Sheets

MASK FOR FABRICATING SEMICONDUCTOR DEVICES AND METHOD FOR DESIGNING THE SAME

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to a method for designing a mask capable of decreasing the fabrication cost, and more particularly, to a method for designing a mask capable of decreasing the fabrication cost by reducing the fabricating area of the mask, which uses the required quantity of wafers, the die size and the fabrication cost of the die to calculate the minimum total cost.

BACKGROUND OF THE INVENTION

The stepper is the most expensive equipment used in the fabrication of an integrated circuit (IC). Therefore, increasing the throughput of the stepper is always considered as a key factor to improve the fabrication process of the integrated circuit. In order to use the throughput of the stepper efficiently, the wafer foundry does their best to design patterns within the available area of the mask so as to reduce the exposure frequency and exposure time.

For 0.13 µm generation process, the development cost of a set of masks has increased to about $1.0 million, which is too much to be affordable for a middle or small IC design house. Therefore, a wafer foundry in Taiwan, "Taiwan Semiconductor Manufacturing Company" has developed a solution called "Cyber Shuttle" or "Multi-Project Mask" to reduce the cost of developing a mask by the IC design house. The Cyber Shuttle divides each mask into several blocks, and different IC design houses will then subscribe required blocks and share the total design and fabrication cost of the mask. Consequently, the shared design and fabrication cost of the mask for each IC design house will be decreased. However, the Cyber Shuttle is only suitable for the integrated circuit to be fabricated by the process of the same generation and with a high compatibility, and an IC design house using a leading fabrication process may not find another IC design house using the same generation fabrication process to share the cost of the mask.

In addition, the IC design house may modify the circuit layout several times during the development of the die to verify the electrical property and qualification, and each modification of the circuit layout needs a new mask. Generally speaking, about 3 to 5 sets of masks are required to complete the development of the die, which results in the cost of the mask representing the majority of the total cost of the die. Particularly, this business model is feasible for fabricating a large number of IC dies since multiple IC dies can share the expensive fabrication cost of the mask equally. However, diversified IC dies with small quantity requirements are not suitable for the above-mentioned business model since fabrication costs of the mask shared by each die are relatively high. Therefore, further decreasing the cost of the mask, which is also decreases the cost of the die and increases the competitiveness of IC design house, is an important objective.

BRIEF SUMMARY OF THE INVENTION

The objective of the present invention is to provide a method for designing a mask capable of decreasing the fabrication cost by reducing the fabricating area of the mask, which uses the required quantity of wafers, the die size and the fabrication cost of the die to calculate the minimum total cost.

In order to achieve the above-mentioned objective, and avoid the problems of the prior art, the present invention discloses a method for designing a mask capable of decreasing the fabrication cost. The method comprises steps of calculating the maximum layout number of patterns on a mask substrate, calculating a first mask cost for a first mask including a first pattern number, calculating a first fabrication cost for fabricating a predetermined number of wafers including a plurality of dies using the first mask, and calculating a first total cost by adding the first mask cost and the first fabrication cost. Subsequently, the present method performs steps of calculating a second mask cost for a second mask including a second pattern number smaller than the maximum layout number, calculating a second fabrication cost for fabricating the predetermined number of wafers using the second mask, and calculating a second total cost by adding the second mask cost and the second fabrication cost. Finally, the present method selects a lower total cost from the first total cost and the second total cost to design the pattern number on the mask substrate. Similarly, the present method calculates different total costs corresponding to different pattern number on the mask substrate, which can be used to find the lowest total cost of the predetermined number of wafers.

BRIEF DESCRIPTION OF THE SEVERAL VIEWS OF THE DRAWINGS

Other objectives and advantages of the present invention will become apparent upon reading the following description and upon reference to the accompanying drawings.

DETAILED DESCRIPTION OF THE INVENTION

As the critical dimension for designing integrated circuits shrinks, the optical proximity effect becomes more and more serious. To reduce the distortion of layout graphs due to the optical proximity effect, the optical proximity correction for a designed layout graph is performed in a more precise manner, and the size of graph files such as a GDS file of the integrated circuit design increases several ten folds after the optical proximity correction. As a result, electron beam lithographic apparatus will consume a lot of time exposing patterns for a mask. For example, the electron beam lithographic apparatus generally needs at least 20 hours to fabricate a piece of mask for 0.13 μm process after the optical proximity correction. The advanced electron beam lithographic apparatus is most expensive in the semiconductor apparatus and the bottleneck for fabricating the mask.

While the electron beam lithographic apparatus is the bottleneck for fabricating the mask, the subsequent defect inspection and repair apparatus also influences the fabrication cost of the mask. As the exposure area of the electron beam lithographic apparatus increases, the time for performing exposure increases, and the difficulty of the defect inspection and repair increases since the specification become more and more restrictive. In addition, the process control for a larger area becomes more difficult and the probability for a defect overstepping the specification dramatically increases. In view of the above-mentioned concern, the fabrication cost of the mask can be dramatically reduced if the exposure time of the electron beam lithographic apparatus can be effectively decreased to increase the yield of the mask.

Figure 1:
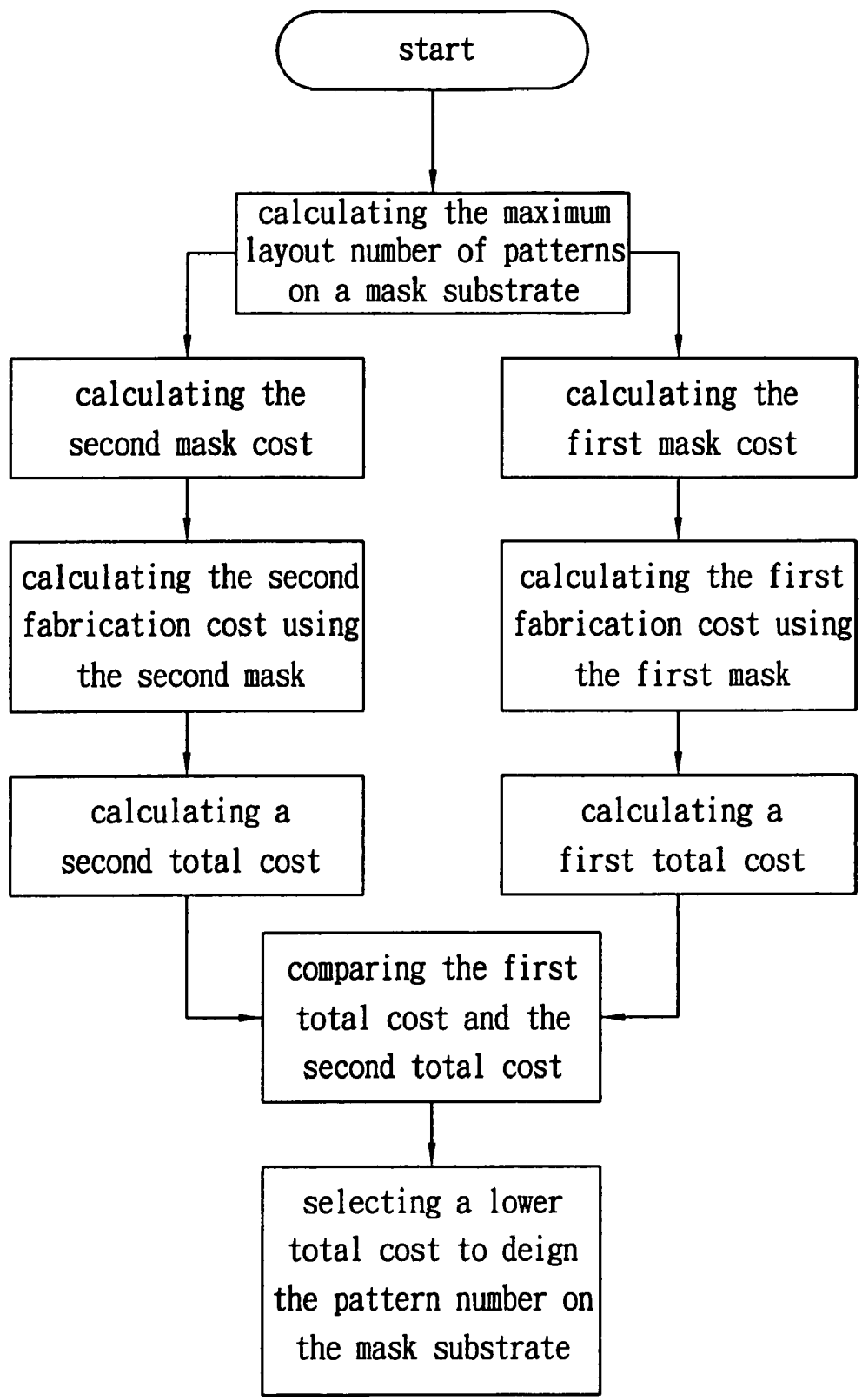
FIG. 1 to FIG. 3 are a flow diagram illustration and schematic views of illustrations showing a method for designing a mask according to the present invention.
Figure 2:
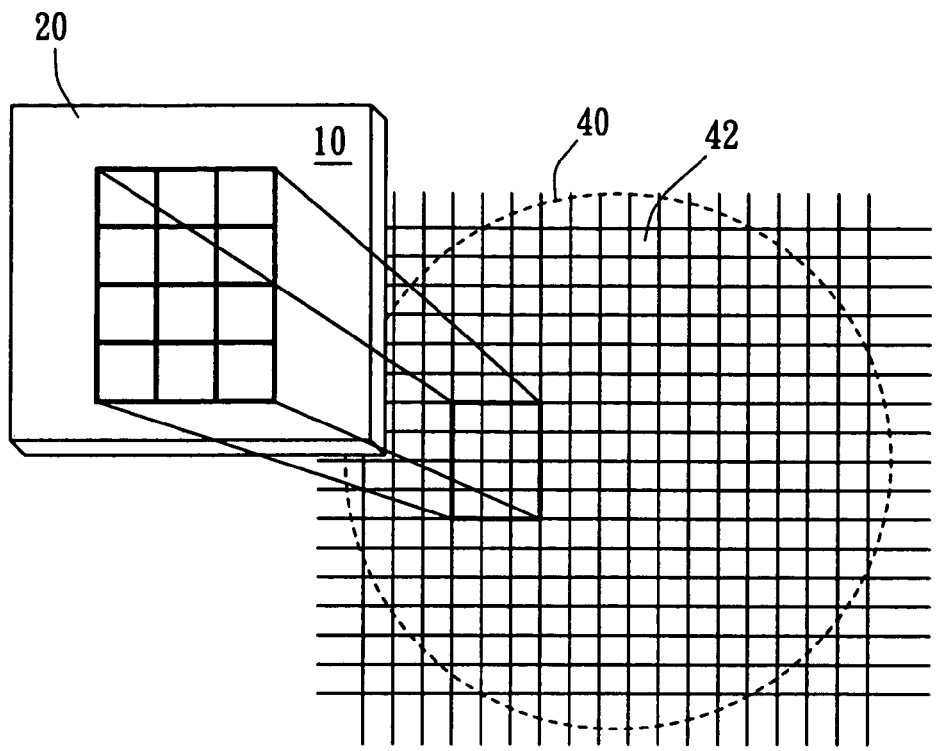
Figure 3:
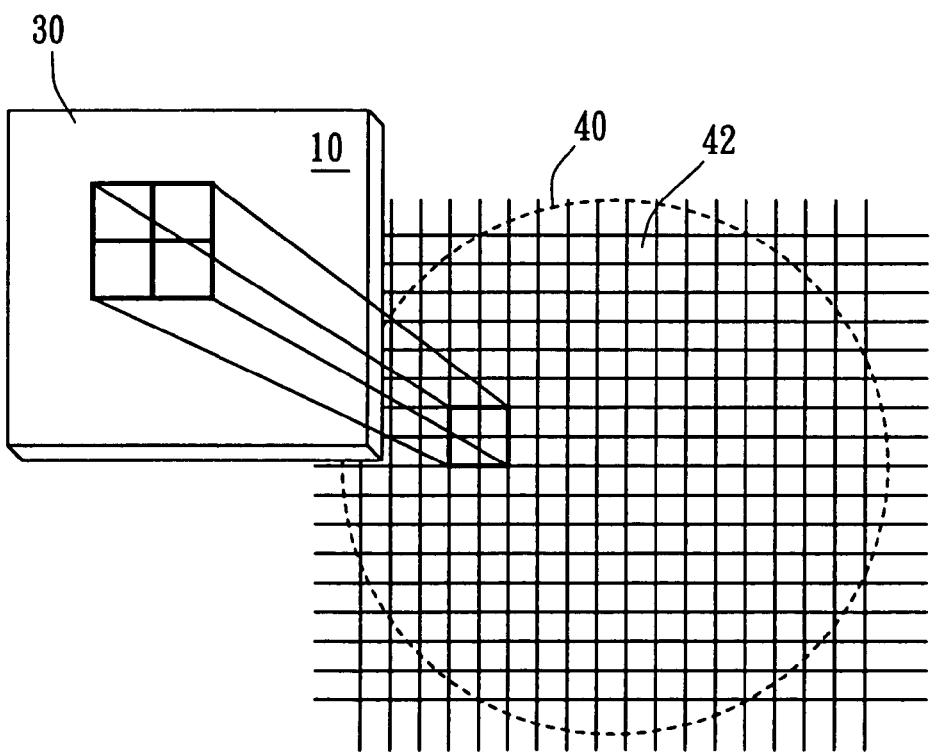

FIG. 1 to FIG. 3 illustrate a method for designing a mask for semiconductor fabrication according to the present invention. The present invention can be applied at least to the semiconductor and the thin film transistor liquid crystal display. As shown in FIG. 1, the present method first calculates the maximum layout number of a mask substrate 10, and then calculates the first mask cost for a first mask 20 including a first pattern number, wherein the first pattern number is preferably equal to the maximum layout number, i.e., the mask substrate 10 is filled with patterns as completely as possible, as shown in FIG. 2. Subsequently, the present method calculates the first fabrication cost for fabricating a predetermined number of wafers 40 with a plurality of dies 42 using the first mask 20 and then adds the first mask cost and the first fabrication cost to generate a first total cost.

The method calculates a second mask cost for a second mask 30 including a second pattern number, wherein the second pattern number is smaller than the maximum layout number, i.e., the mask substrate is not filled with patterns, as shown in FIG. 3. For example, the second pattern number on the second mask 30 is one third of the first pattern number on the first mask 20. Subsequently, the present method calculates the second fabrication cost for fabricating the predetermined number of wafers 40 using the second mask 30 and then adds the second mask cost and the second fabrication cost to generate a second total cost. The first total cost is compared with the second total cost, and the mask with the lower total cost is used to actually design the pattern on the mask substrate 10. In other words, the mask substrate 10 is fabricated as the first mask 20 if the first total cost is lower, otherwise, the mask substrate 10 is fabricated into the second mask 30 since the second total cost is lower.

Figure 4:
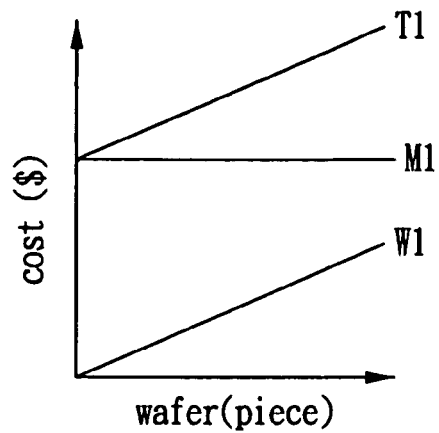
FIG. 4 is a graph illustration showing the relationship between the first mask cost, the fabrication cost of the predetermined number of wafers, and the first total cost.

FIG. 4 illustrates the relationship between the first mask cost (M1), the first fabrication cost (W1) for fabricating the predetermined number (N) of wafers 40, and the first total cost (T1). As shown in FIG. 4, the first mask cost (M1) is $450,000; the first fabrication cost (W1) for fabricating the wafer 40 using the first mask 20 is $1,800/piece; the first total cost (T1) is equal to $450,000+1,800*N.

Figure 5:
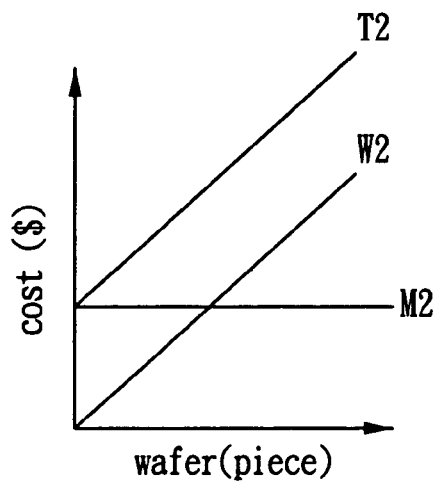
FIG. 5 is a graph illustration showing the relationship between the second mask cost, the fabrication cost of the predetermined number of wafers, and the second total cost.

FIG. 5 illustrates the relationship between the second mask cost (M2), the second fabrication cost (W2) for fabricating the predetermined number (N) of wafers 40, and the second total cost (T2). The second mask cost (M2) is calculated according to the following equation:

$$M2=M1*\{(1-P1)+P1/F\};$$

P1 represents a facility cost for fabricating the first mask divided by the M1, and F represents the maximum layout number divided by the second pattern number on the second mask 30. For example, the maximum layout number is 12, the second pattern number is 4, and F=12/4=3. In addition, the first fabrication cost (M1) of the first mask 20 is $450,000, the facility cost occupies 80% of the first mask cost (P1=80%), and the second mask cost (M2) of the second mask 30 is $210,000 according to the above equation.

The second fabrication cost (W2) for fabricating the predetermined number (N) of wafers 40 is calculated according to the following equation:

$$W2=W1*\{(1-P2)+P2*F\}*N;\text{ and}$$

P2 represents an exposure cost for fabricating the wafer 40 divided by the W1. For example, the lithographic cost of the wafer occupies 40% (0.4) of W1, the exposure cost occupies 60% (0.6) of the lithographic cost, and P2=0.4*0.6=0.24 (24%).

Figure 6:
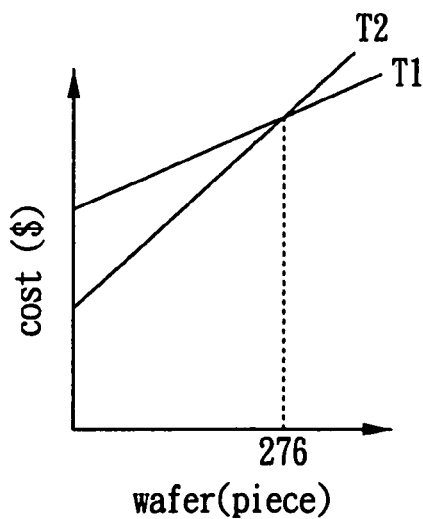
FIG. 6 is a graph illustration showing the relationship between the first total cost, the second total cost, and the predetermined number of wafers.

FIG. 6 illustrates the relationship between the first total cost (T1), the second total cost (T2), and the predetermined number (N) of wafers, wherein the critical number is 276. As shown in FIG. 6, the second total cost (T2) is lower than the first total cost (T1) when the predetermined number (N) is smaller than 276. In other words, using the second mask 30 to fabricate the predetermined number (N) of wafer 40 can decrease the cost of the die 42 when the required quantity of wafers is smaller than 276. Inversely, the cost of the die 42 can only be decreased by using the first mask 20 to fabricate the predetermined number (N) of wafer 40 when the required quantity of wafers is larger than 276.

In addition, the above-mentioned embodiment illustrates the second mask 30 with 4 patterns, and one skilled in the art can anticipate the number of pattern on the second mask 30 which can be any factor such as 1, 2, 3, 4, and 6 of the maximum layout number except the maximum factor. In other words, the above-mentioned embodiment compares only the total cost corresponding to the maximum factor (12) and another factor (4) of the maximum layout number. If the second mask 30 includes another number of patterns, the relationship between the second total cost (T2) and the predetermined number (N) will changes, and the critical number varies accordingly. Therefore, to design the pattern number on the mask, it is preferable to perform steps of calculating the required quantity of wafers from the required number of dies and the yield of the fabrication process, calculating the total cost corresponding to all factors of the maximum layout number, and determining the number of patterns on the mask according to the lowest total cost and the required quantity of wafers.

Figure 7:
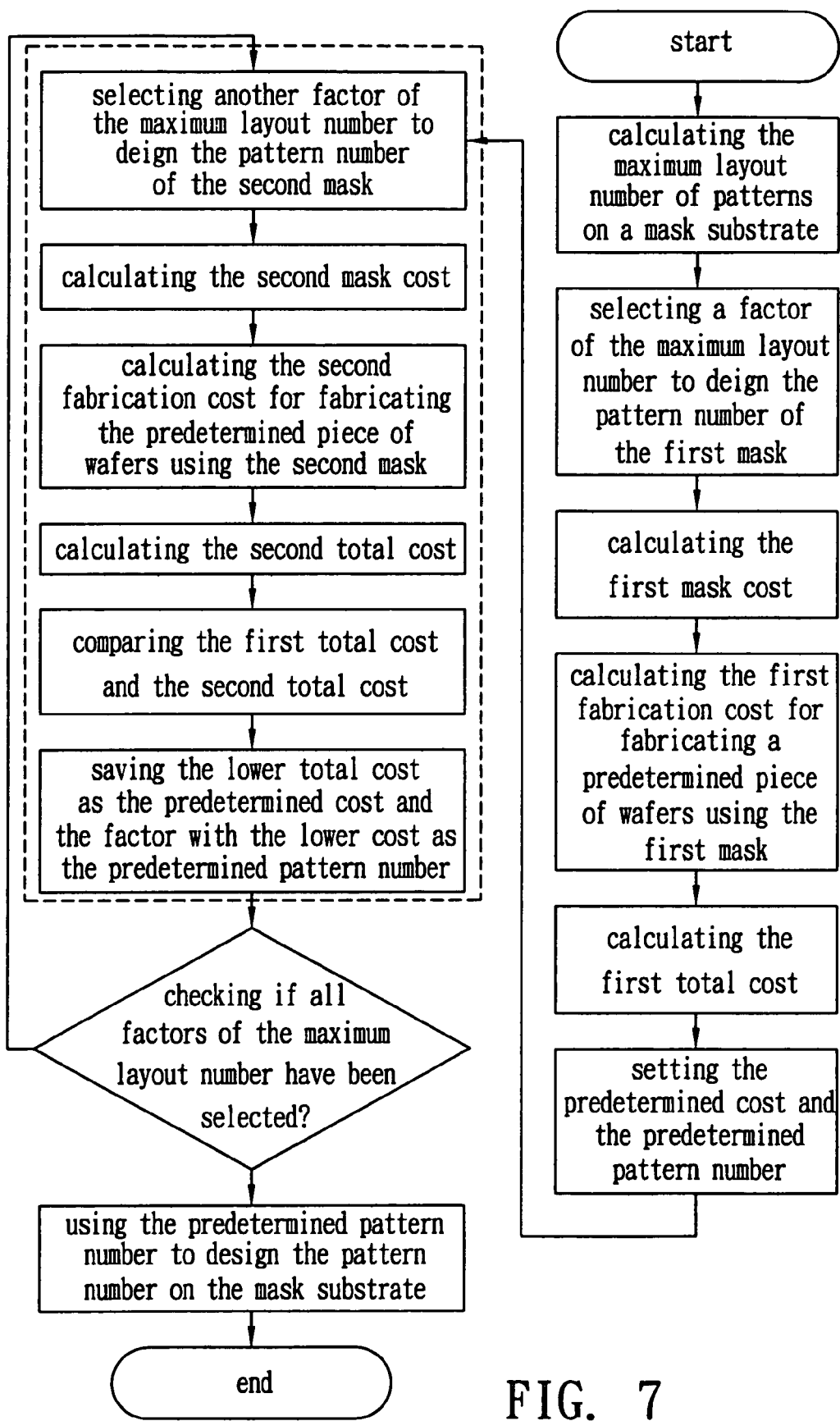
FIG. 7 is a flow diagram illustration showing a systematic flow diagram for designing a mask according to the present invention.

FIG. 7 illustrates a systematic flow diagram for designing a mask according to the present invention, wherein the required quantity of wafer is calculated according to the required number of dies and the yield of the fabrication process in advance. As shown in FIG. 7, the method comprises steps of calculating the maximum layout number of patterns on a mask substrate, selecting a first factor of the maximum layout number to design the pattern number on a first mask, calculating a first mask cost for the first mask and a first fabrication cost for fabricating a predetermined number of wafers using the first mask to generate a first total cost by adding the first mask cost and the first fabrication cost. Subsequently, the first factor is set as a predetermined pattern number and the first total cost is set as a predetermined cost.

The method then performs steps of selecting a second factor of the maximum layout number to design the pattern number on a second mask, calculating a second mask cost for the second mask and a second fabrication cost for fabricating the predetermined number of wafers using the second mask to generate a second total cost by adding the second mask cost and the second fabrication cost. The second total cost is compared with the predetermined cost, and the second total cost is saved as the predetermined cost and the second factor is saved as the predetermined pattern number if the second total cost is smaller than the predetermined cost.

If there is a factor not selected before, the steps in the dash line are repeated until all factors have been selected. The predetermined pattern number is the one with the lowest total cost if all factors have been selected. Therefore, the total cost will be the lowest if the pattern number on the mask substrate is equal to the predetermined pattern number and using the mask with predetermined pattern number to fabricate the predetermined number of wafers. The present method for designing the mask can optionally assign another pattern on an unused area of the mask substrate, and this other pattern is used to define the shape of another layer.

Figure 8:
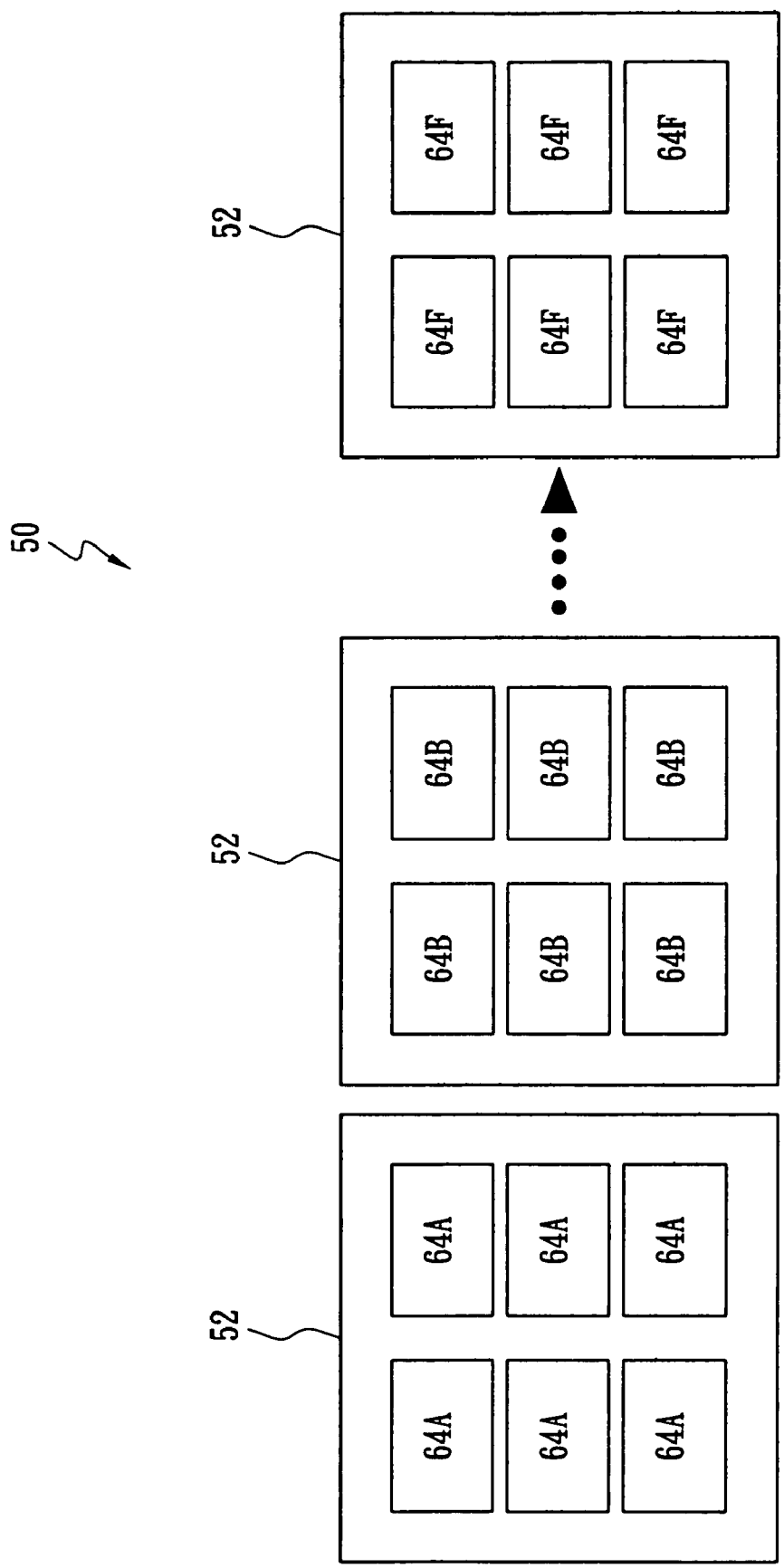
FIG. 8 and FIG. 9 are schematic views of illustrations showing a mask set applied to fabricate a die according to the prior art.
Figure 9:
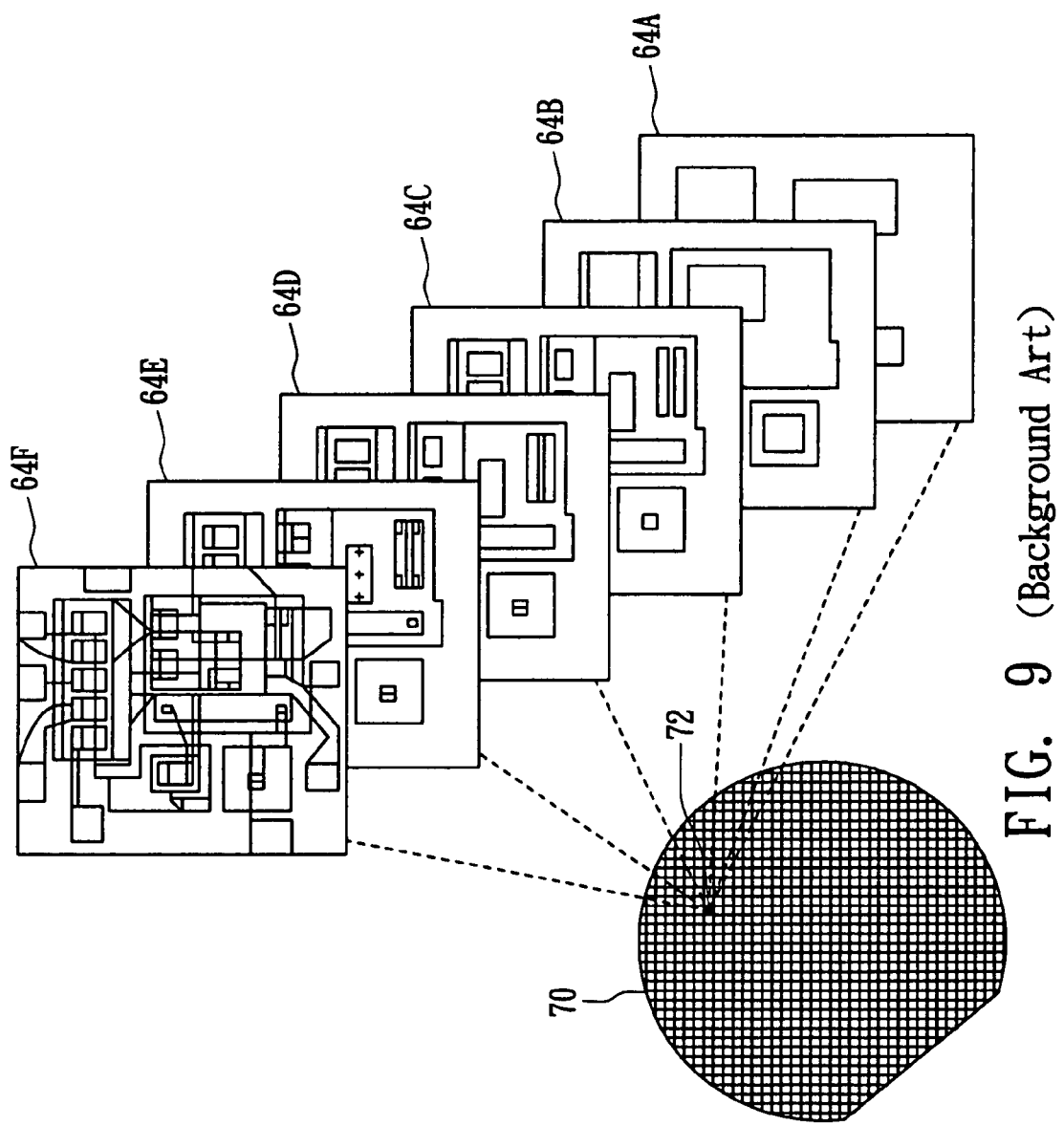

FIG. 8 and FIG. 9 illustrate a mask set 50 applied to fabricate a die according to the prior art. The mask set 50 includes 6 pieces of mask 52, and each mask 52 is filled with repeated patterns, wherein the pattern 64A, 64B, . . . , and 64F are used to define the shape of different layer on the die 72 on the wafer 70, as shown in FIG. 9. Since the die 72 needs to define the shape of 6 layer, the prior art need to prepare 6 pieces of mask 52 to define the shape of the 6 layer, respectively. However, the fabrication cost of the 6 pieces of mask 52 is very expensive, the shared mask cost of each die 72 is high, and the developing cost for the die 72 increases dramatically if the required amount of the die 72 is small.

Figure 10:
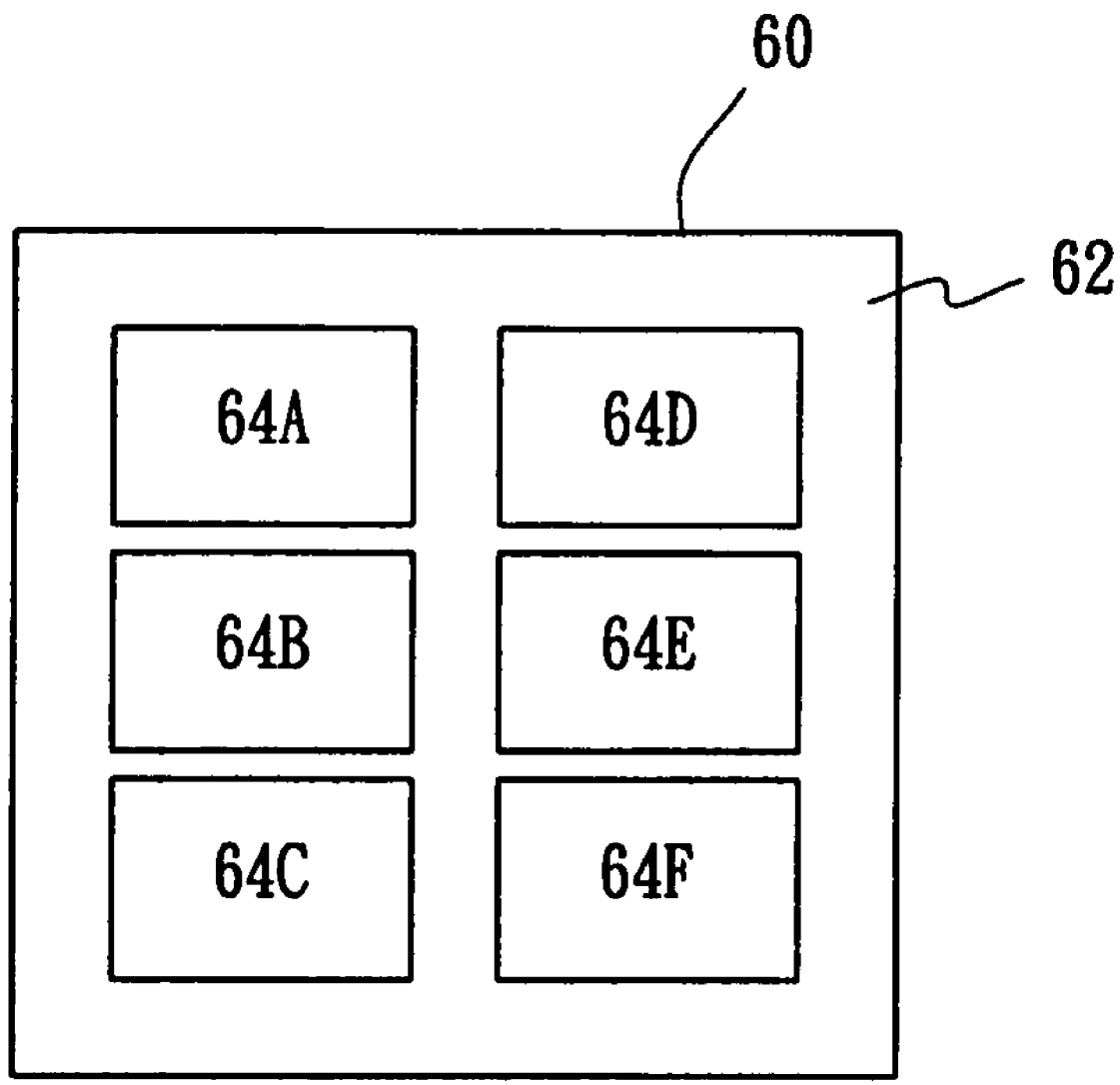
FIG. 10 is another schematic view of an illustration showing a mask capable of decreasing the fabrication cost according to the present invention.

FIG. 10 illustrates a mask 60 capable of decreasing the fabrication cost according to the present invention. The mask 60 comprises a substrate 62 and a plurality of patterns pattern 64A, 64B, 64C, 64D, 64E, and 64F positioned on different portions of the substrate 62. For preparing a small quantity with a variety of integrated circuit dies, the present method for designing mask does not use the entire area of the substrate, and other patterns for defining the shape of the other layer can assigned to the unused area of the substrate 62.

Figure 11A:
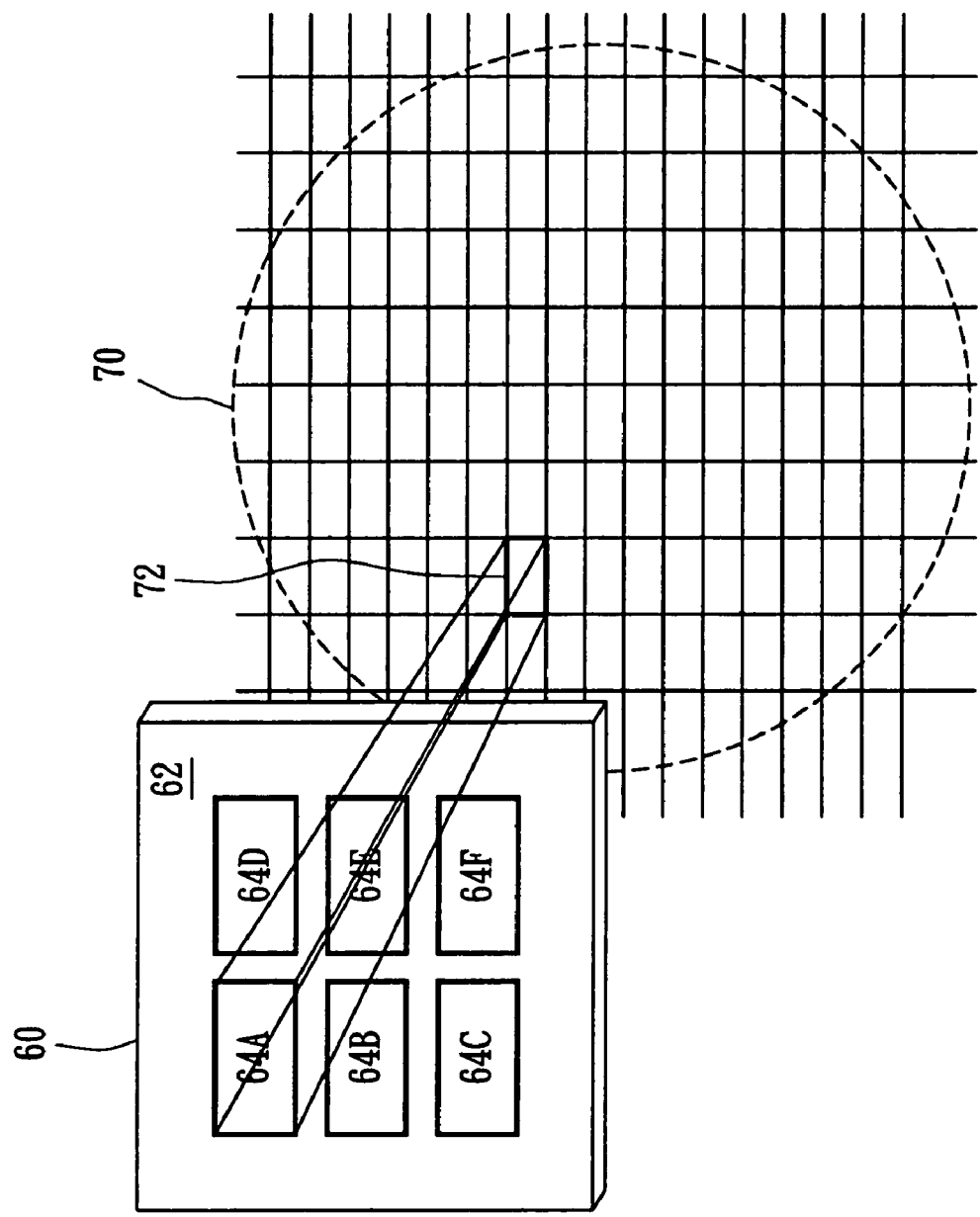
FIG. 11(a) and FIG. 11(b) illustrate are also schematic views of illustrations showing a mask applied to fabricate a die according to the present invention.
Figure 11B:
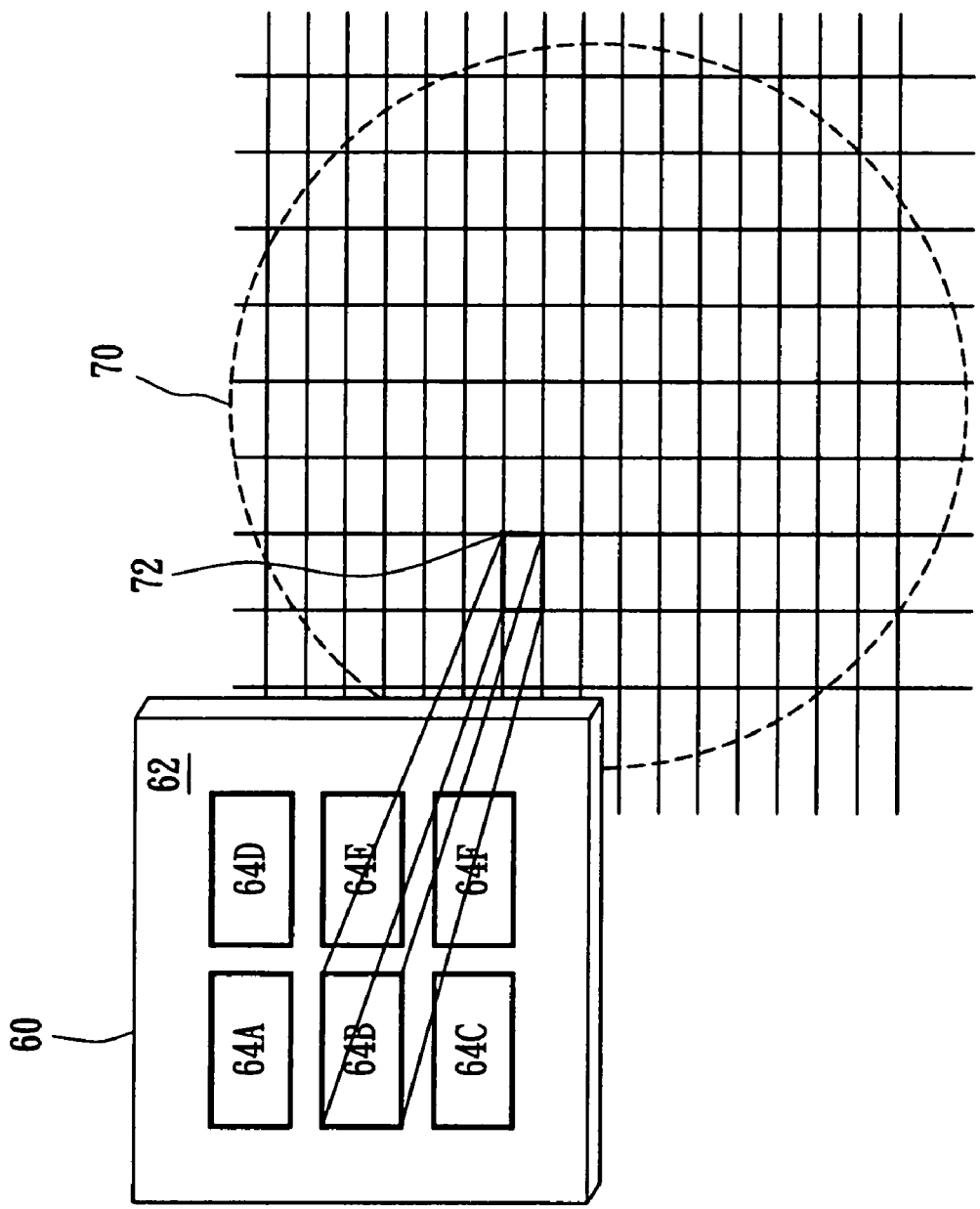

FIG. 11(a) and FIG. 11(b) illustrate the mask 60 applied to fabricate the die 72 according to the present invention. The pattern 64A is used to define the shape of a predetermined layer of the die 72 on the wafer 70, while the pattern 64B is used to define the shape of another layer of the die 72 on the wafer 70. Similarly, the pattern 64C, 64D, 64E, and 64F are used to define the shape of a different layer of the die 72 on the wafer 70. Compared with the prior art shown in FIG. 8 and FIG. 9, the present invention integrates pattern of 6 piece of mask 52 into a single mask 60. Consequently, the cost and the number of mask for preparing the integrated circuit die 72 can be reduced, and the total cost of the die is therefore decreased. In other words, the present invention is suitable for developing a small quantity with a variety of integrated circuit dies.

Compared with the prior art, the present invention decreases the cost for fabricating the mask by reducing the area of the exposure pattern on the mask. Although reducing the area of the exposure pattern will slightly increase the cost for fabricating the wafer, the reduced cost for the mask is much larger than the increased cost for the wafer, and the present invention can effectively decrease the total cost of the integrated circuit die. In addition, reducing the area of the exposure pattern also reduces the probability to generate defects, but increases the uniformity of lines and overlay precision, which will further improve the yield of the mask. Furthermore, layout patterns for different layers can be assigned to the same mask to reduce the number of the mask, which can decrease the cost of the mask dramatically according to the present invention.

The above-described embodiments of the present invention are intended to be illustrative only. Numerous alternative embodiments may be devised by those skilled in the art without departing from the scope of the following claims.

I claim:

1. A method for designing a mask comprising steps of:
    calculating a first mask cost for a first mask including a first pattern number;
    calculating a first fabrication cost for fabricating a predetermined number of wafers using the first mask;
    calculating a first total cost by adding the first mask cost and the first fabrication cost;
    calculating a second mask cost for a second mask including a second pattern number;
    calculating a second fabrication cost for fabricating the predetermined number of wafers using the second mask;
    calculating a second total cost by adding the second mask cost and the second fabrication cost; and
    selecting a lower total cost from the first total cost and the second total cost to design the pattern number on a mask substrate.

2. The method for designing the mask of claim 1, wherein the second mask cost (M2) is calculated according to the following equation:

$$M2=M1\times\{(1-P1)+P1/F\};$$

wherein M1 represents the first mask cost, P1 represents a facility cost for fabricating the first mask divided by M1, and F represents a maximum layout number of the pattern on the mask substrate divided by the second pattern number.

3. The method for designing the mask of claim 1, wherein the second fabrication cost (W2) is calculated according to the following equation:

$$W2=W1\times\{(1-P2)+P2\times F\}\times N;$$

wherein W1 represents a cost for fabricating one wafer using the first mask, P2 represents an exposure cost for fabricating the wafer divided by W1, N represents the predetermined number, and F represents a maximum layout number of the pattern on the mask substrate divided by the second pattern number.

4. The method for designing the mask of claim 1, wherein the first pattern number and the second pattern number are selected from factors of a maximum layout number of the pattern on the mask substrate.

5. The method for designing the mask of claim 4, wherein the first pattern number is the maximum layout number of the pattern on the mask substrate.

6. The method for designing the mask of claim 1, wherein the pattern is used to define the shape of a first layer on the wafer, and the method further comprising a step of designing another pattern on an unused area of the mask substrate for defining a shape of second layer on the wafer.

7. The method for designing the mask of claim 1, the method being applied to a fabrication of integrated circuits and a thin film transistor liquid crystal display.

8. A method for designing a mask comprising the steps of:
   (a) calculating a maximum layout number of patterns on a mask substrate;
   (b1) selecting a first factor of the maximum layout number to design a pattern number on a first mask;
   (b2) calculating a first mask cost for the first mask and a first fabrication cost for fabricating a predetermined number of wafers using the first mask to generate a first total cost;
   (b3) setting the pattern number on a first mask as a predetermined pattern number and the first total cost as a predetermined cost;
   (c1) selecting a second factor of the maximum layout number to design the pattern number on a second mask;
   (c2) calculating a second mask cost for the second mask and a second fabrication cost for fabricating the predetermined number of wafers using the second mask to generate a second total cost; and
   (d) comparing the second total cost and the predetermined cost, and setting the second total cost as a predetermined cost and the second factor as the predetermined pattern number if the second total cost is smaller than the predetermined cost.

9. The method for designing a mask of claim 8, further comprising the steps of:
   repeating steps (c1), (c2), and (d) until all factors of the maximum layout number are selected; and
   using the predetermined pattern number to design the pattern number on the mask substrate.

10. The method for designing the mask of claim 8, wherein the second mask cost (M2) is calculated according to the following equation:

$$M2 = M1 \times \{(1-P1) + P1/F\};$$

wherein M1 represents the first mask cost, P1 represents a facility cost for fabricating the first mask divided by M1, and F represents the maximum layout number of the pattern on the mask substrate divided by the second pattern number.

11. The method for designing the mask of claim 8, wherein the second fabrication cost (W2) is calculated according to the following equation:

$$W2 = W1 \times \{(1-P2) + P2 \times F\} \times N;$$

wherein W1 represents a fabrication cost for fabricating one wafer using the first mask, P2 represents an exposure cost for fabricating the wafer divided by W1, N represents a predetermined number of wafers, and F represents the maximum layout number of the pattern on the mask substrate divided by the second pattern number.

12. The method for designing the mask of claim 8, wherein the first pattern number is the maximum layout number of the pattern on the mask substrate.

13. The method for designing the mask of claim 8, wherein the pattern is used to define a first shape of a first layer on the wafer, and the method further comprises designing another pattern on an unused region of the mask substrate for defining a second shape of a second layer on the wafer.

14. The method for designing the mask of claim 8, the method being applied to a fabrication of integrated circuits and a thin film transistor liquid crystal display.

\* \* \* \* \*